US009238875B2

(12) United States Patent
Zhu et al.

(10) Patent No.: US 9,238,875 B2
(45) Date of Patent: Jan. 19, 2016

(54) MULTILAYER STRUCTURE FOR A DIAMOND GROWTH AND A METHOD OF PROVIDING THE SAME

(75) Inventors: Hexiang Zhu, Bradenton, FL (US); Karl Pearson, Bradenton, FL (US); Joo Ro Kim, Bradenton, FL (US)

(73) Assignee: Sunset Peak International Limited, Singapore (SG)

( * ) Notice: Subject to any disclaimer, the term of this patent is extended or adjusted under 35 U.S.C. 154(b) by 1212 days.

(21) Appl. No.: 12/929,567

(22) Filed: Feb. 1, 2011

(65) Prior Publication Data

US 2012/0192785 A1 Aug. 2, 2012

(51) Int. Cl.
*C30B 29/04* (2006.01)
*B01J 3/06* (2006.01)

(52) U.S. Cl.
CPC .......... *C30B 29/04* (2013.01); *B01J 3/062* (2013.01); *B01J 2203/061* (2013.01); *B01J 2203/062* (2013.01); *B01J 2203/068* (2013.01); *B01J 2203/0655* (2013.01); *Y10T 117/10* (2015.01)

(58) Field of Classification Search
None
See application file for complete search history.

(56) References Cited

U.S. PATENT DOCUMENTS

| | | |
|---|---|---|
| 3,142,539 A | 7/1964 | Brinkman et al. |
| 3,407,445 A | 10/1968 | Strong |
| 4,034,066 A * | 7/1977 | Strong .............. B01J 3/062 117/224 |
| 4,042,673 A | 8/1977 | Strong |
| 4,073,380 A | 2/1978 | Strong et al. |
| 4,290,741 A | 9/1981 | Kolchin et al. |
| 4,322,396 A | 3/1982 | Strong |
| 4,518,334 A | 5/1985 | Ishizuka |
| 4,632,817 A | 12/1986 | Yazu et al. |
| 4,836,881 A | 6/1989 | Staoh et al. |
| 5,221,411 A | 6/1993 | Narayan |
| 5,980,982 A * | 11/1999 | Degawa et al. ............ 427/185 |
| 6,030,595 A | 2/2000 | Sumiya et al. |
| 6,129,900 A | 10/2000 | Satoh et al. |
| 7,101,433 B2 | 9/2006 | D'Evelyn et al. |
| 7,547,358 B1 | 6/2009 | Shapiro |
| 2004/0134415 A1 | 7/2004 | D'Evelyn et al. |
| 2006/0032431 A1 | 2/2006 | Sung |
| 2006/0288927 A1 | 12/2006 | Chodelka et al. |
| 2006/0292302 A1 | 12/2006 | Chodelka et al. |
| 2010/0059892 A1 | 3/2010 | Takei et al. |

OTHER PUBLICATIONS

International Search Report and Written Opinion for Intl. App. No. PCT/US2012/23301, dated May 15, 2012 (3 pages).
U.S. Appl. No. 13/157,899, filed Jun. 10, 2011, Zhu et al.
U.S. Appl. No. 13/332,636, filed Dec. 21, 2011, Kim et al.
Bundy et al, "Diamond-Graphite Equilibrium Line from Growth and Graphitization of Diamond", Journal of Chemical Physics, 35(2):383-391 (1961).

* cited by examiner

*Primary Examiner* — Guinever S Gregorio
(74) *Attorney, Agent, or Firm* — Fish & Richardson P.C.

(57) ABSTRACT

A multi-layer structure in a reaction cell for a diamond growth is provided. The multi-layer structure includes: a diamond seed; a first metal catalyst layer provided on the diamond seed, the first metal catalyst layer containing a first concentration of carbon; a second metal catalyst layer provided on the first metal layer, the second metal catalyst layer containing a second concentration of carbon that is higher than the first concentration; and a carbon source layer provided on the second metal layer.

15 Claims, 2 Drawing Sheets
(1 of 2 Drawing Sheet(s) Filed in Color)

MULTILAYER STRUCTURE FOR A DIAMOND GROWTH AND A METHOD OF PROVIDING THE SAME

BACKGROUND OF THE INVENTION

1. Field of the Invention

The present subject matter relates generally to a multi-layer structure in a reaction cell for growing a diamond and a method of providing the multi-layer structure, particularly to a multi-layer structure including a multi-layer metal solvent catalyst for stabilizing the initial diamond crystal growth by the temperature gradient method and a method of providing the same.

2. Related Art

Growing diamond crystals using a high temperature and high pressure processes via a temperature gradient method is generally known in the art, for example, as described in U.S. Pat. No. 4,034,066. As a result of subsequent large-scale production, grown diamonds are commercially available as heat sinks, super-precision cutting tools, and other fabricated products.

The diamond growth process includes a reaction cell which contains graphite as a carbon source, a diamond seed crystal, and a solvent metal. The solvent metal separates the carbon source from the seed crystal. During growth of diamond crystals, the carbon source dissolves into the solvent metal upon heating, and a temperature gradient exists between the carbon source and seed crystal. Temperature and pressure are regulated to permit diamond crystal growth on the seed crystal. By very carefully adjusting pressure and temperature and utilizing a small temperature gradient with extended growth times, larger diamonds can be produced. However, attempts to increase crystal sizes have shown a strong tendency for spontaneous nucleation of diamond crystals to occur at the underside of the molten catalyst-solvent metal. This develops into a serious problem, because the diamond nucleation occurring near the seed diamond competes with the growth from the seed diamond, resulting in the development of multiple crystals which collide as they grow. In addition, the seed diamond may be dissolved if the metal solvent composition is improper, resulting in no growth from the seed crystal at all.

The prior art for the growth of diamonds uses a single layer metal catalyst that provides a fixed composition of the solvent catalyst. A disadvantage of only a single layer metal catalyst is that high quality single diamond crystal growth can only be achieved by a precise control of temperature and/or pressure. If the temperature is too high, the seed diamond will be completely dissolved and thereby no diamond growth will be obtained. On the other hand, if the temperature is too low, the tendency of spontaneous nucleation will be increased. To increase the productivity, the temperature gradient is preferably set as high as possible. This will, however, increase the tendency of spontaneous nucleation. Thus, according to the prior art adopting a single-layer metal catalyst, the operable pressure/temperature window for high-quality diamond crystals is narrow. For commercial High Pressure High Temperature (HPHT) diamond production, it is preferable to have a wider operating window for high quality diamond crystal growth.

SUMMARY OF THE INVENTION

The present subject matter provides a multi-layer structure in a reaction cell for diamond growth and a method of providing the same. The multi-layer structure includes: a diamond seed; a first metal catalyst layer provided on the diamond seed, the first metal catalyst layer containing a first concentration of carbon; a second metal catalyst layer provided on the first metal layer, the second metal catalyst layer containing a second concentration of carbon that is higher than the first concentration; and a carbon source layer provided on the second metal layer.

According to an aspect, the subject matter includes a seed pad provided below the diamond seed and the first metal catalyst layer.

According to another aspect, the subject matter includes a copper foil provided between the diamond seed and the first metal catalyst layer; and a ceramic layer provided on the carbon source layer.

According to a further aspect of the subject matter, the first metal catalyst layer suppresses the growth of multiple crystals on the seed pad, and the second metal catalyst layer suppresses the dissolution of the diamond seed.

According to a further aspect of the subject matter, the first metal catalyst layer suppresses the spontaneous growth of multiple crystals.

According to a further aspect of the subject matter, the second metal catalyst layer suppresses the dissolution of the diamond seed so that an average diamond weight of grown diamonds is about 2.80 ct.

According to a further aspect, the subject matter provides a multi-layer metal solvent catalyst in a reaction cell for stabilizing an initial diamond growth using a temperature gradient generated therein. The multi-layer metal solvent catalyst includes: a lower metal layer having a first carbon concentration, which is located on top of a diamond seed; and an upper metal layer having a second carbon concentration that is higher than the first carbon concentration.

BRIEF DESCRIPTION OF THE DRAWINGS

The file of this patent contains at least one drawing executed in color. Copies of this patent with color drawing(s) will be provided by the Office upon request and payment of the necessary fee.

These and other aspects of the subject matter will be apparent with reference to the examples in the following description and with reference to the accompanying drawings, wherein FIG. 1 schematically shows a multi-layer structure including metal catalyst layers according to an embodiment of the present subject matter.

DETAILED DESCRIPTION OF THE INVENTION

Figure 1:
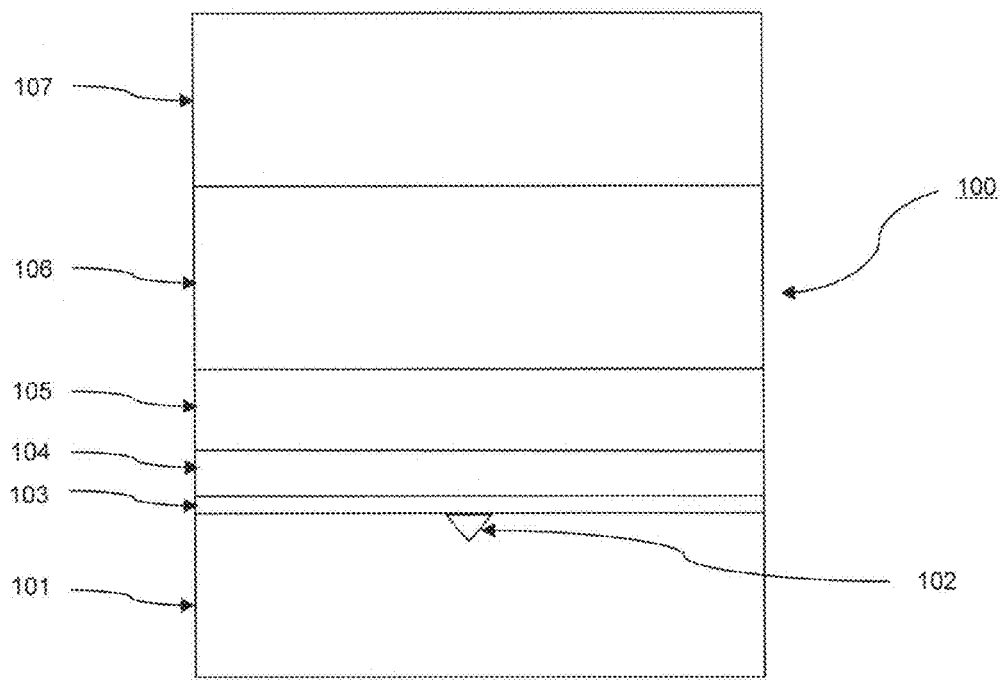

The Figures are diagrammatic and not drawn to scale. In the Figures, elements which correspond to elements already described have the same reference numerals.

FIG. 1 schematically shows a multi-layer structure 100 including metal catalyst layers according to an embodiment of the present subject matter. On one surface of a seed pad 101, a recess is produced to accommodate a diamond seed 102 therein. Then, a bottom metal disc 104 with a lower concentration of carbon is deposited on the surface of the seed pad 101. A copper (Cu) foil 103 can optionally be deposited on the surface of the seed pad 101 and under the bottom metal disc 104. A top metal disc 105 with a higher concentration of carbon is deposited on the surface of the bottom metal disc 104. Then, a graphite source 106, as a carbon source, is deposited on a surface of the top metal disc 105. A ceramic layer 107 can be included on top of the carbon source 106.

The bottom metal disc 104 has a lower concentration of carbon than the top metal disc 105. In an embodiment of the present disclosure, the bottom metal disc is made from an iron-nickel (Fe—Ni) alloy with the nickel being present in a concentration from about 0% to about 90% by weight. In this embodiment, the carbon concentration is between about 1.0% and about 7.0% by weight of the catalyst composition.

Likewise, the top metal disc 105 has a higher concentration of carbon than the bottom metal disc 104. In an embodiment of the present disclosure, the top metal disc is made from an iron-nickel (Fe—Ni) alloy with the nickel being present in a concentration from about 0% to about 90% by weight and the carbon is present in a concentration from about 2.0% to about 9.0% by weight. Even though the ranges of the carbon concentration in the top metal disc and the bottom metal disc overlap, it is understood that carbon concentration in the bottom metal disc will be lower than the carbon concentration in the top metal disc.

The above constitution is to provide the multiple layers of metals 104, 105 as solvent catalysts. The composition of the solvent catalyst is important in the purity and color of the diamond crystal grown. The high pressure, high temperature (HPHT) diamond crystal growth process works well when the solvent catalyst used has multiple layers 104, 105, each with a different concentration of metals and carbon. In particular, the layer of the solvent catalyst 104 closest to the seed pad 101 is to contain a slightly lower amount of carbon than the layer 105 adjacent to the graphite source 106. The lower concentration of carbon closest to the seed pad 101 helps ensure that multiple crystals are not grown on the seed pad 101, while the higher concentration of carbon adjacent to the graphite source 106 helps ensure that there is a sufficient of amount of carbon to maintain the seed 102 and keep it from dissolving. The multi-layer metal solvent catalyst developed in this disclosure is unique and provides an efficient technique which allows a precise control of initial diamond crystal growth. A summary of the experimental results of production runs with the two-layer metal discs is provided below in Table 1.

TABLE 1

|  | Single-layer disc (4.4 wt % Carbon) | Two-layer metal discs (top 5.0 wt % Carbon/bot. 4.0 wt % Carbon; FIG. 1) |
|---|---|---|
| % Grade 1 + 2 diamonds grown | 52.2% | 61.7% |
| % Spontaneous nucleation | 28.3% | 4.9% |
| Total runs | 44 | 81 |
| Average Diamond Weight (ct) | 2.55 | 2.80 |

Figure 2:
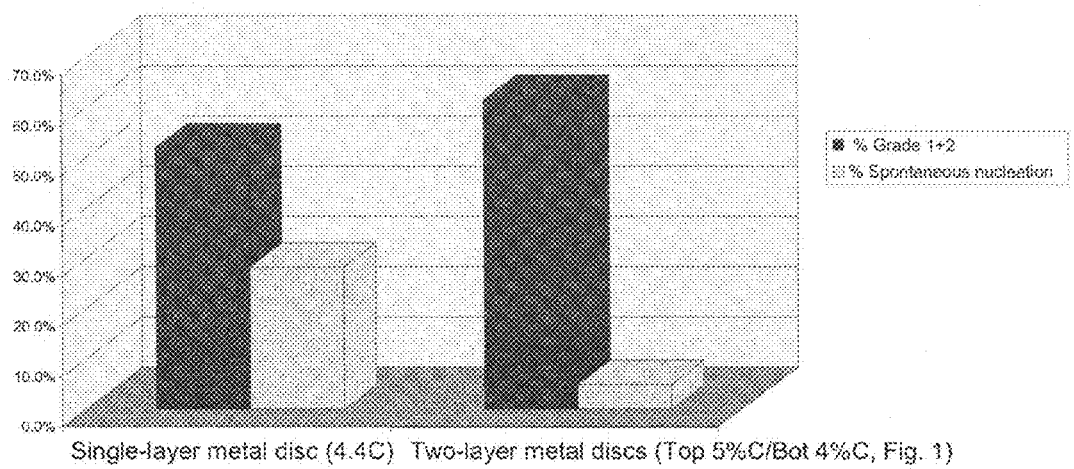
FIG. 2 is a three-dimensional bar chart showing the effect of metal catalyst design on the quality of stones according to the experimental results indicated in Table 1.

Table 1 shows the effect of design of the two-disc catalyst system on the quality of stones. These results are visualized by the three-dimensional bar chart shown in FIG. 2. As can be seen in Table 1, due to the lower carbon concentration metal layer that was located adjacent to the diamond seed for preventing the spontaneous nucleation, spontaneous nucleation occurrence was reduced from about 28.3% to about 4.9%. Also, the higher carbon concentration metal layer, which was located between the graphite source and the lower carbon concentration layer, kept the diamond seed from dissolving.

Table 1 indicates that it is possible to ensure the single crystal diamond growth under very wide pressure and temperature ranges, according to the present subject matter. High quality, large diamond crystals can be grown at a large growth speed up to 20 mg/hour (average diamond weight increased from 2.55 ct to 2.80 ct as shown in Table 1) when the growth is conducted at temperatures between 1200 and 2000° C. and pressure between 5.0 and 7.5 GPa.

Figure 3:
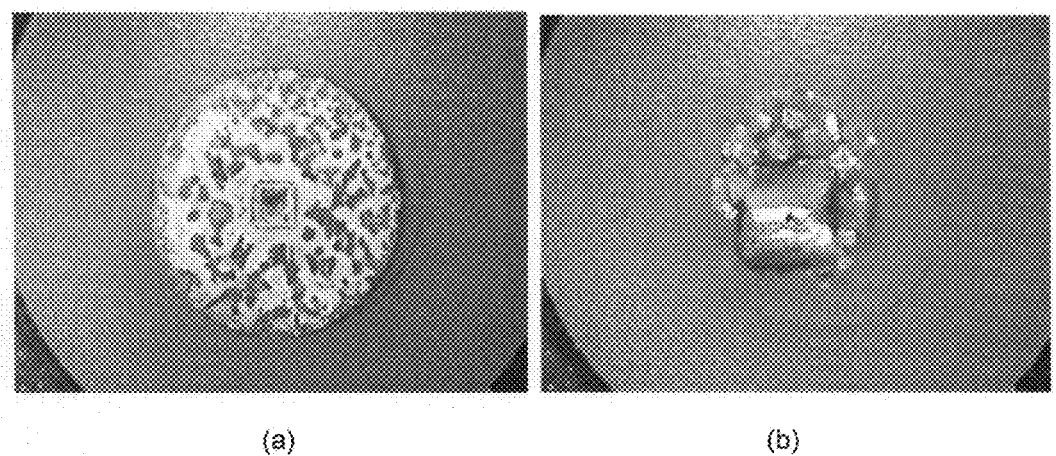
FIG. 3 is a typical picture showing a spontaneous nucleation around the central diamond according to prior art.
Figure 4:
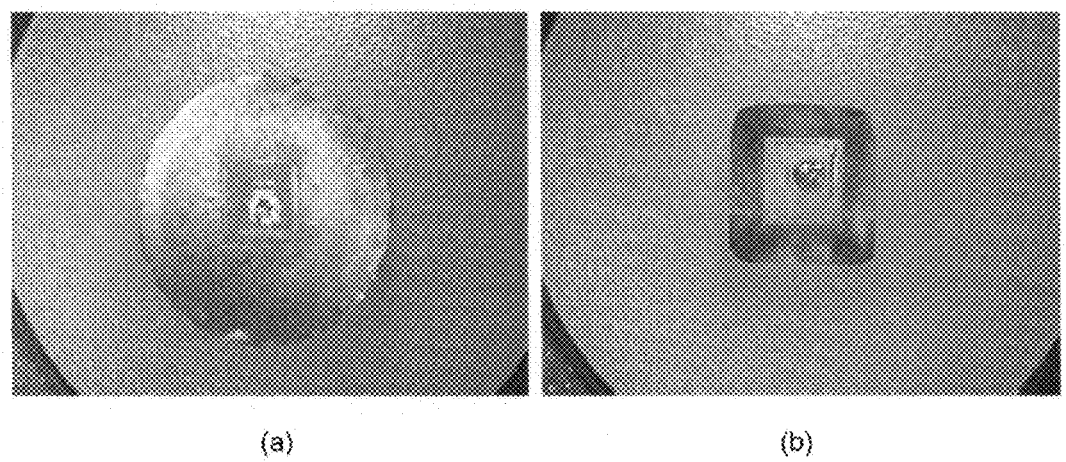
FIG. 4 is a typical picture showing a single crystal diamond without spontaneous growth according to the present subject matter.

FIG. 3 is a typical picture showing a spontaneous nucleation around the central diamond according to prior art; and FIG. 4 is a typical picture showing a single crystal diamond without spontaneous growth according to the present subject matter. As can be seen, the spontaneous nucleation around the central diamond that is typically witnessed in the prior art diamond growth (FIG. 3) is remarkably reduced when using the multi-layer metal catalyst according to the present subject matter.

The present subject matter also relates to a method of growing a diamond. The method includes the steps of providing a diamond seed; depositing a first metal catalyst layer on the diamond seed, the first metal catalyst layer containing a first concentration of carbon; depositing a second metal catalyst layer on the first metal layer, the second metal catalyst layer containing a second concentration of carbon that is higher than the first concentration; depositing a carbon source layer on the second metal layer; and applying sufficient temperature (between 1200 and 2000° C.) and pressure (between 5.0 and 7.5 GPa) to grow the diamond.

Although the present subject matter has been described with reference to the illustrated embodiment, the present subject matter is not limited thereto. It will be obvious that the same may be varied in many ways. Such variations are not to be regarded as a departure from the spirit and scope of the subject matter, and all such modifications as would be obvious to one skilled in the art are intended to be included within the scope of the following claims.

What is claimed is:

1. A multi-layer structure in a reaction cell for diamond growth, comprising:
   a diamond seed;
   a first metal catalyst layer provided on only the top of the diamond seed, the first metal catalyst layer containing a first concentration of carbon;
   a second metal catalyst layer provided on top of the first metal catalyst layer, the second metal catalyst layer containing a second concentration of carbon that is higher than the first concentration; and
   a carbon source layer provided on top of the second metal catalyst layer, whereby none of the layers coat the entire diamond seed.

2. The multi-layer structure according to claim 1, further comprising a seed pad provided directly below the diamond seed and the first metal catalyst layer.

3. The multi-layer structure according to claim 2, further comprising:
   a copper foil provided between the diamond seed and the first metal catalyst layer; and
   a ceramic layer provided on the carbon source layer.

4. The multi-layer structure according to claim 2, wherein said seed pad further includes a recess to accommodate said diamond seed.

5. The multi-layer structure according to claim 1, wherein the carbon concentration is between about 1% to 7% by weight in the first metal catalyst layer.

6. The multi-layer structure according to claim 1, wherein the carbon concentration is between about 2% to 9% by weight in the second metal catalyst layer.

7. A multi-layer metal solvent catalyst in a reaction cell for stabilizing an initial diamond growth using a temperature gradient generated therein, comprising:
- a first metal layer having a first carbon concentration, which is located on only the top of a diamond seed; and
- a second metal layer having a second carbon concentration that is higher than the first carbon concentration, said second metal layer being located on top of said first metal layer, whereby none of the layers coat the entire diamond seed.

8. A method of growing a diamond, comprising:
providing a diamond seed;
depositing a first metal catalyst layer on only the top of the diamond seed, the first metal catalyst layer containing a first concentration of carbon;
depositing a second metal catalyst layer on top of the first metal catalyst layer, the second metal catalyst layer containing a second concentration of carbon that is higher than the first concentration;
depositing a carbon source layer on top of the second metal catalyst layer, whereby none of the layers coat the entire diamond seed;
and
applying sufficient temperature and pressure to grow the diamond.

9. The method according to claim 8, further comprising a seed pad provided directly below the diamond seed and the first metal catalyst layer.

10. The method according to claim 9, wherein, prior to applying the temperature and pressure, the method further comprising:
providing a copper foil between the diamond seed and the first metal catalyst layer; and
depositing a ceramic layer on the carbon source layer.

11. The method according to claim 9, wherein the first metal catalyst layer suppresses the spontaneous growth of multiple crystals on the seed pad, and the second metal catalyst layer suppresses the dissolution of the diamond seed.

12. The method according to claim 11, wherein the lower carbon concentration in the first metal catalyst layer decreases the spontaneous growth of multiple crystals from about 28% to about 4.9%.

13. The multi-layer structure according to claim 11, wherein the higher carbon concentration in the second metal catalyst layer increases an average grown diamond weight from about 2.55 ct to about 2.80 ct.

14. A multi-layer structure in a reaction cell for diamond growth, comprising:
- a diamond seed;
- a first metal catalyst layer provided on only the top of the diamond seed, the first metal catalyst layer containing a first concentration of carbon;
- a seed pad provided directly below the diamond seed and the first metal catalyst layer
- a second metal catalyst layer provided on top of the first metal layer, the second metal catalyst layer containing a second concentration of carbon that is higher than the first concentration;
- a carbon source layer provided on top of the second metal catalyst layer; and
- a ceramic layer provided on top of the carbon source layer, whereby none of the layers coat the entire diamond seed.

15. The multi-layer structure according to claim 14, further comprising:
a copper foil provided between the diamond seed and the first metal catalyst layer.

* * * * *